United States Patent
Sitaram

(10) Patent No.: US 6,723,657 B2
(45) Date of Patent: Apr. 20, 2004

(54) METHOD FOR FABRICATING A GATE STACK IN VERY LARGE SCALE INTEGRATED SEMICONDUCTOR MEMORIES

(75) Inventor: Arkalgud Sitaram, Erlangen (DE)

(73) Assignee: Infineon Technologies AG, Munich (DE)

( * ) Notice: Subject to any disclaimer, the term of this patent is extended or adjusted under 35 U.S.C. 154(b) by 53 days.

(21) Appl. No.: 10/159,155

(22) Filed: May 31, 2002

(65) Prior Publication Data

US 2003/0036278 A1 Feb. 20, 2003

(30) Foreign Application Priority Data

May 31, 2001 (DE) .......................................... 101 26 579

(51) Int. Cl.$^7$ ............................................. H01L 21/302
(52) U.S. Cl. ...................... 438/745; 438/581; 438/649; 438/754; 438/755
(58) Field of Search ................................. 438/581, 592, 438/649, 655, 745, 750, 751, 755

(56) References Cited

U.S. PATENT DOCUMENTS

| | | | | |
|---|---|---|---|---|
| 5,851,890 A | * | 12/1998 | Tsai et al. | 438/303 |
| 6,074,922 A | * | 6/2000 | Wang et al. | 438/303 |
| 6,184,117 B1 | * | 2/2001 | Lu | 438/592 |
| 6,423,634 B1 | * | 7/2002 | Wieczorek et al. | 438/655 |
| 6,602,781 B1 | * | 8/2003 | Xiang et al. | 438/655 |

* cited by examiner

*Primary Examiner*—Lan Vinh
(74) *Attorney, Agent, or Firm*—Laurence A. Greenberg; Werner H. Stemer; Gregory L. Mayback

(57) ABSTRACT

A method for the fabrication of a gate stack, in particular in very large scale integrated semiconductor memories, uses a combination of a damascene process and a CMP process to produce a gate stack which includes a polysilicon section, a silicide section and a covering-layer section thereabove. The gate stack can be fabricated by using conventional materials, has a very low sheet resistance of <1 ohm/unit area and may carry self-aligning contact sections.

9 Claims, 2 Drawing Sheets

METHOD FOR FABRICATING A GATE STACK IN VERY LARGE SCALE INTEGRATED SEMICONDUCTOR MEMORIES

BACKGROUND OF THE INVENTION

FIELD OF THE INVENTION

The invention relates to a method for fabricating a gate stack in very large scale integrated semiconductor memories.

The integration of semiconductor circuits with a very large scale packing density requires gate stacks which have a very low sheet resistance (less than 5 to 10 ohms/unit area), in order to reduce time delays caused by inevitable RC paths. At the same time, the DRAM technology for the fabrication of compact bit cells requires the formation of self-aligning contact sections.

Heretofore, it has been attempted to solve those problems by using gate stacks formed of tungsten silicide. Unfortunately, gate stacks of that type have a high sheet resistance (for example approximately 25 ohms/unit area). If one attempts to reduce the sheet resistance by making the silicide layer thicker, the complexity of the processes is increased, since each stack etching process lasts longer and the contact etching process has to reach a deeper level. The use of lower-resistance silicides ($CoSi_2$ or $TiSi_2$) involves the problem of a stack of polysilicon and Co or Ti silicide not being able to be etched and having a low thermal stability during subsequent stack processes. Other types of gate stack materials, such as for example WN/W, are of limited use due to their insufficient stability under oxidizing process conditions.

SUMMARY OF THE INVENTION

It is accordingly an object of the invention to provide a method for fabricating a gate stack, in particular in very large scale integrated semiconductor memories, which overcomes the hereinafore-mentioned disadvantages of the heretofore-known methods of this general type in such a way that the gate stack has a low resistance, can be fabricated by using conventional materials and is compatible with a self-aligning contact section.

With the foregoing and other objects in view there is provided, in accordance with the invention, a method for fabricating a gate stack above a substrate section of a semiconductor memory covered by a gate oxide layer, in very large scale integrated semiconductor memories. The method comprises the following steps:

a) applying a polysilicon layer above the gate oxide layer;
b) applying a silicon nitride layer above the polysilicon layer as a mask layer for a subsequent damascene process;
c) selectively etching an opening, with a side wall and a base, into the silicon nitride layer, down to the polysilicon layer, in the relevant substrate section;
d) covering the silicon nitride layer, including the side wall and the base of the opening, with a Ti or Co layer;
e) converting the Ti or Co at the base of the opening into a silicide section through a conditioning process;
f) removing unsilicided Ti or Co;
g) forming a covering layer entirely over the substrate section, covering the silicon nitride layer and filling the opening above the silicide section;
h) removing the covering layer down to the silicon nitride layer, while retaining the covering layer in the opening;
i) selectively etching the silicon nitride layer down to the polysilicon layer, leaving a gate stack formed of $TiSi_2$ or $CoSi_2$ and a section of the covering layer remaining above the $TiSi_2$ or $CoSi_2$, in the opening;
j) selectively etching the polysilicon layer down to the gate oxide, with the gate stack functioning as a hard mask; and
k) applying a spacer wall around a periphery of the gate stack.

The fact that the method according to the invention, in a significant aspect, uses a damascene process (either nitride, as illustrated, or oxide) to form a thick, self-aligning silicide gate layer (either $TiSi_2$ or $CoSi_2$), on which a covering layer formed either of oxide or nitride can then be deposited, means that the invention is able to form self-aligning contacts. The gate stack achieves a sheet resistance of <1 ohm/unit area and can be fabricated by using standard materials. This method can be used particularly advantageously for the fabrication of very large scale integrated semiconductor memories or for embedded memories.

Other features which are considered as characteristic for the invention are set forth in the appended claims.

Although the invention is illustrated and described herein as embodied in a method for fabricating a gate stack in very large scale integrated semiconductor memories, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
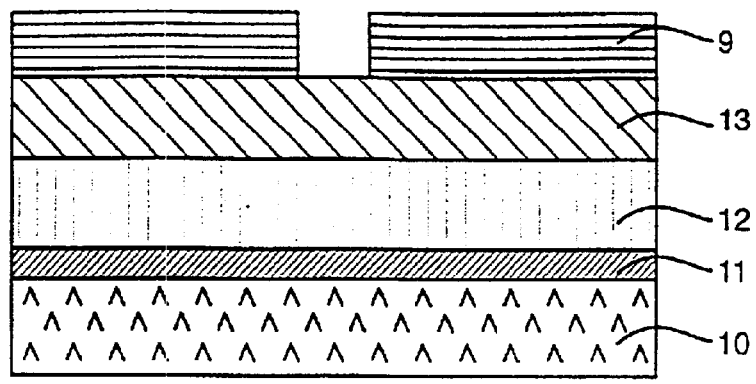
FIGS. 1 to 7 are diagrammatic, cross-sectional views of a semiconductor wafer, illustrating sequential method steps involved in the fabrication of a gate stack according to the invention.

Referring now to the figures of the drawings in detail and first, particularly to FIG. 1 thereof, it is seen that either an $n^+$-polysilicon layer 12 or an undoped polysilicon layer 12 is applied on top of a gate oxide layer 11 which lies on a substrate 10. A thick silicon nitride layer 13 is deposited above the polysilicon layer 12. PECVD nitride is recommended, for the following reasons: high deposition rate, excellent oxide to nitride selectivity, ease of modification of stresses and ease of etching by wet etching.

A photoresist layer 9 is, applied on top of the silicon nitride layer 13 and is provided with a pattern for the formation of an opening 14 after exposure and development in the silicon nitride layer 13. Then, an etching step is used to etch the silicon nitride layer 13 using the patterned photoresist layer 9, and the photoresist layer 9 is then removed.

Figure 2:
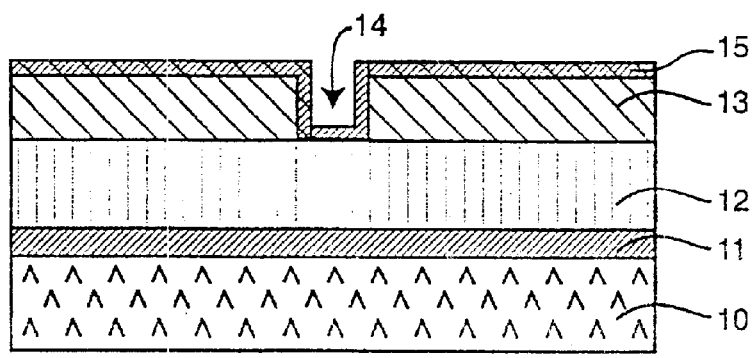

FIG. 2 shows that the opening 14 which is formed by this preceding etching step and the surface of the remaining silicon nitride layer 13 are covered with a titanium or cobalt layer 15. This titanium or cobalt layer 15 covers the side wall and the base of the opening 14.

It is optionally possible to use additional oxide spacers in order to produce even smaller openings 14. Furthermore, the undoped polysilicon 12 may optionally be doped with $n^+$ and $p^+$ implants in order to fabricate a dual-function gate stack.

Figure 3:
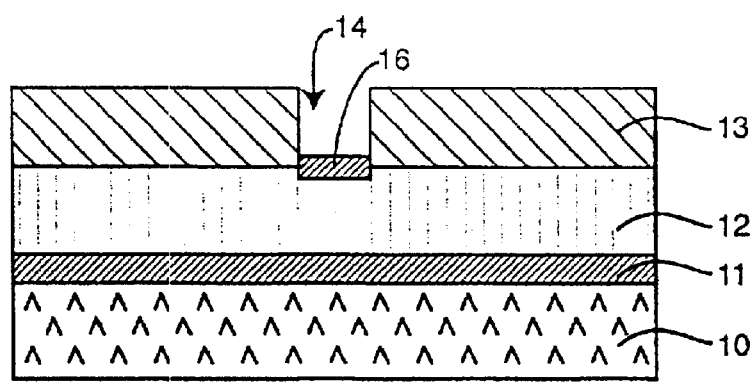

Then, as shown in FIG. 3, the wafer is conditioned, preferably in a furnace. In the process, a silicide section 16 is formed at the base of the opening 14. This section 16 is a $TiSi_2$ or a $CoSi_2$ section, depending on whether Ti or Co is used for the layer 15.

The Ti or Co of the layer 15 which does not react during the conditioning is then etched selectively, with the $TiSi_2$ or $CoSi_2$ section 16 at the base of the opening 14 remaining in place.

Figure 4:
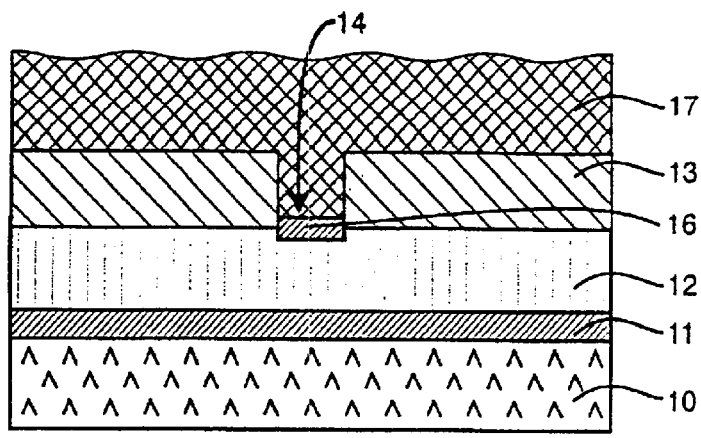

Then, as shown in FIG. 4, a thick covering layer 17 is deposited either as an oxide layer or as a silicon nitride layer, filling the opening 14 above the silicide section 16.

Figure 5:
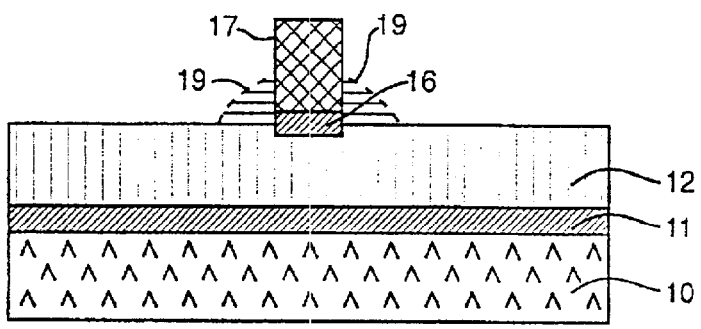

Then, this covering layer 17, with the exception of a section of the covering layer 11 which remains above the silicide section 16, is removed down to the silicon nitride layer 13 through the use of a CMP process. Then, the silicon nitride layer 13 is subjected to wet-etching, with the stack which lies in the opening 14, being formed of the silicide section 16 with the oxide or nitride section 17 above it, remaining in place (FIG. 5). Then, the polysilicon layer 12 is etched down to the gate oxide layer 11. Prior to the etching, it is optionally possible to apply a spacer wall 19 in order to protect the silicide section 16 from being altered or damaged during subsequent process steps (DT, HF, . . . ). This spacer wall or jacket 19 is illustrated in dashed lines in FIG. 5.

Figure 6:
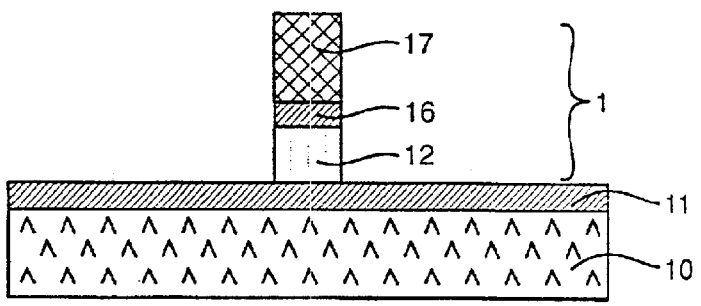

During the etching of the polysilicon layer 12, the stack including the silicide section 16 and the section of the covering layer 17 formed of oxide or nitride located above it serves as a hard mask. Therefore, the gate stack including the polysilicon section 12, the silicide section 16 above it and the section 17 of the covering layer which is shown in FIG. 6, remains in place.

Figure 7:
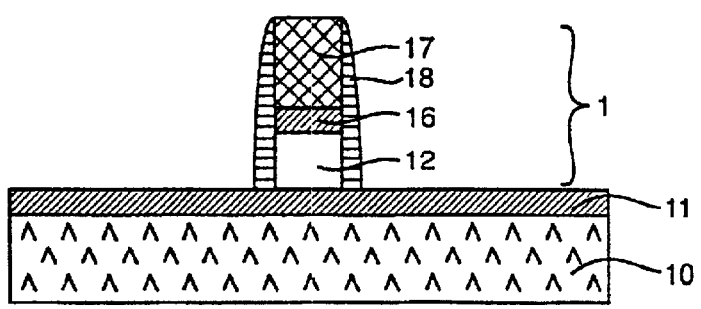

Finally, as shown in FIG. 7, a spacer wall 18 is disposed around the periphery of a gate stack 1. Further process steps are carried out with the spacer jacket 18 forming protection against damage to the gate stack 1.

The above description makes it clear that with the method according to the invention, which combines a damascene process with a CMP process, it is possible to fabricate a polysilicon/silicide gate stack which is provided with a covering layer and can carry self-aligning contact sections. This gate stack has a very low resistance, the sheet resistance of which is <1 ohm/unit area, and can be achieved by using conventional materials. The method according to the invention can be used particularly advantageously for the fabrication of very large scale integrated memory components or for the fabrication of embedded memory structures.

To summarize, the invention describes a method for fabricating a gate stack in very large scale integrated semiconductor memories which, using conventional materials, achieves a gate stack with self-aligning silicide and contact sections as well as a very low sheet resistance of the gate stack.

I claim:

1. A method for fabricating a gate stack above a substrate section covered by a gate oxide layer, in very large scale integrated semiconductor memories, which comprises the following steps:

a) applying a polysilicon layer above the gate oxide layer;

b) applying a silicon nitride layer above the polysilicon layer as a mask layer for a subsequent damascene process;

c) selectively etching an opening, with a side wall and a base, into the silicon nitride layer, down to the polysilicon layer, in the substrate section;

d) covering the silicon nitride layer, including the side wall and the base of the opening, with a Ti or Co layer;

e) converting the Ti or Co at the base of the opening into a silicide section through a conditioning process;

f) removing unsilicided Ti or Co;

g) forming a covering layer entirely over the substrate section, covering the silicon nitride layer and filling the opening above the silicide section;

h) removing the covering layer down to the silicon nitride layer, while retaining the covering layer in the opening;

i) selectively etching the silicon nitride layer down to the polysilicon layer, leaving a gate stack formed of $TiSi_2$ or $CoSi_2$ and a section of the covering layer remaining above the $TiSi_2$ or $CoSi_2$, in the opening;

j) selectively etching the polysilicon layer down to the gate oxide, with the gate stack functioning as a hard mask; and k) applying a spacer wall around a periphery of the gate stack.

2. The method according to claim 1, wherein the covering layer formed in step g) is an oxide layer.

3. The method according to claim 1, wherein the covering layer formed in step g) is a silicon nitride layer.

4. The method according to claim 1, which further comprises carrying out the step of removing the covering layer in step h) by a CMP process.

5. The method according to claim 1, wherein the selective etching step in step i) is a wet-etching process.

6. The method according to claim 1, wherein the spacer wall applied in step k) is a nitride spacer wall.

7. The method according to claim 1, which further comprises carrying out the conditioning step e) in a furnace.

8. The method according to claim 1, which further comprises carrying out a step i') between the step i) and the step j), and performing the step i') by forming a spacer wall to protect the silicide against subsequent processes carried out on the gate stack.

9. The method according to claim 8, which further comprises removing the spacer wall protecting the silicide before the step j).

* * * * *